US008059396B2

(12) United States Patent
Chen et al.

(10) Patent No.: US 8,059,396 B2

(45) Date of Patent: Nov. 15, 2011

(54) REMOVABLE ELECTRONIC DEVICE WITH HANDLE STRUCTURE

(75) Inventors: Hung-Chuan Chen, Taoyuan Hsien (TW); Chih-Chi Wu, Taoyuan-Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 131 days.

(21) Appl. No.: 12/349,779

(22) Filed: Jan. 7, 2009

(65) Prior Publication Data

US 2010/0014223 A1 Jan. 21, 2010

(30) Foreign Application Priority Data

Jul. 18, 2008 (TW) ................................ 97127537 A

(51) Int. Cl.
*H05K 7/12* (2006.01)

(52) U.S. Cl. ............ 361/679.37; 361/679.35; 312/223.2

(58) Field of Classification Search .......... 361/679.33–679.39, 679.02, 679.01, 361/679.58; 312/223.1–223.2

See application file for complete search history.

(56) References Cited

U.S. PATENT DOCUMENTS

| | | | | |
|---|---|---|---|---|
| 6,798,650 | B2 * | 9/2004 | Reznikov et al. | 361/679.33 |
| 6,820,953 | B2 * | 11/2004 | Wojcik | 312/332.1 |
| 7,251,132 | B1 * | 7/2007 | Paul et al. | 361/679.33 |
| 7,256,989 | B2 * | 8/2007 | Liu et al. | 361/679.33 |
| 7,423,869 | B2 * | 9/2008 | Su | 361/679.33 |
| 7,511,953 | B2 * | 3/2009 | Tao et al. | 361/679.39 |
| 7,586,740 | B2 * | 9/2009 | Tang | 361/679.27 |
| 2008/0158810 | A1 * | 7/2008 | Liu et al. | 361/685 |

* cited by examiner

*Primary Examiner* — Jinhee Lee

*Assistant Examiner* — Ingrid Wright

(74) *Attorney, Agent, or Firm* — Kirton & McConkie; Evan R. Witt

(57) ABSTRACT

The present invention is related to a removable electronic device with handle structure suitable for an electronic apparatus, including a housing having an accommodating trough, a handle structure, an elastic engaging device, and an engaging component corresponding to the elastic engaging device, wherein the handle structure is pivotally mounted on and received in the accommodating trough through an engagement between the elastic engaging device and the engaging component.

18 Claims, 6 Drawing Sheets

3 331 33 313 312 311 31 321 32

REMOVABLE ELECTRONIC DEVICE WITH HANDLE STRUCTURE

FIELD OF THE INVENTION

The present invention is related to a removable electronic device, and more particularly to a removable electronic device with handle structure.

BACKGROUND OF THE INVENTION

Nowadays, the removable electronic devices, such as, removable power supplier or removable hard disk, are widely applied to many systems, e.g., industrial computer, server, disk array and communication apparatus, for providing sufficient and consistent power or sufficient and manageable data storage, and in the meantime, also convincing the inconvenience arisen as frequently exchanging the power supplier or hard disk, so that the user can experience the convenience of rapid exchange and hot swap.

Take the removable power supplier as example. Generally, for facilitating the exchange of the removable power supplier, a structure similar to the handle will be mounted on the housing of the removable power supplier, so as to provide the user a convenient pulling operation. Please refer to FIG. 1, which is a schematic view showing the removable power supplier with fixed handle structure in the prior art. As shown, the traditional removable power supplier 10 includes a housing 11 and a fixed handle structure 12, wherein the housing 11 is provided with a printed circuit board (not shown), and the fixed handle structure 12 is fixed on two opposite side walls 13 of the housing 11, so as to facilitate a convenient pulling out operation for the user as exchanging the removable power supplier 10.

However, since the fixed handle structure 12 is fixedly mounted on the housing 11 of the power supplier 10 in a protruded state, it is difficult to avoid the idle handle structure 12 from accident collision or pulling and therefore the removable power supplier from being moved at the same time. Besides, the protruded handle structure 12, in addition to occupying space, also influences the integrity of appearance.

Therefore, how to develop a removable electronic device with handle structure which can effectively reduce the extra volume caused from the protruded handle structure and can provide a handle structure with appearance integrity and detaching capability is really an urgent demand.

SUMMARY OF THE INVENTION

The object of the present invention is to provide a removable electronic device with handle structure, in which through an engagement between an elastic engaging device and an engaging component, the handle structure can be pivotally mounted on an accommodating trough formed on the housing of the removable electronic device, so that the occupied space of the handle structure can be saved as idle, and the handle structure also can be rotated out of the accommodating trough by taking the elastic engaging device as an axle center when the user tries to utilize the handle structure to pull out the accommodating through, thereby solving the problem that the conventional handle structure which is directly fixed and protruded on the housing occupies too much space and spoils appearance integrity.

For achieving the object described above, one aspect of the present invention provides a removable electronic device with handle structure suitable for an electronic apparatus including a housing having an accommodating trough, a handle structure, an elastic engaging device, and an engaging component corresponding to the elastic engaging device, wherein the handle structure is pivotally mounted on and received in the accommodating trough through an engagement between the elastic engaging device and the engaging component.

For achieving the object described above, another aspect of the present invention provides an electronic apparatus including a removable electronic device with handle structure. The removable electronic device includes a housing having an accommodating trough, a handle structure, an elastic engaging device, and an engaging component corresponding to the elastic engaging device, wherein the handle structure is pivotally mounted on and received in the accommodating trough through an engagement between the elastic engaging device and the engaging component.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

The present invention is related to a removable electronic device with handle structure. The removable electronic device is mounted in an electronic apparatus, such as, a computer, but not limited thereto. The embodiment described below is based on the removable power supplier, but it should be appreciated that the removable electronic device of the present invention is not only limited to the power supplier but can be implemented as any removable electronic device provided with the following features, such as removable hard disk.

Figure 1:
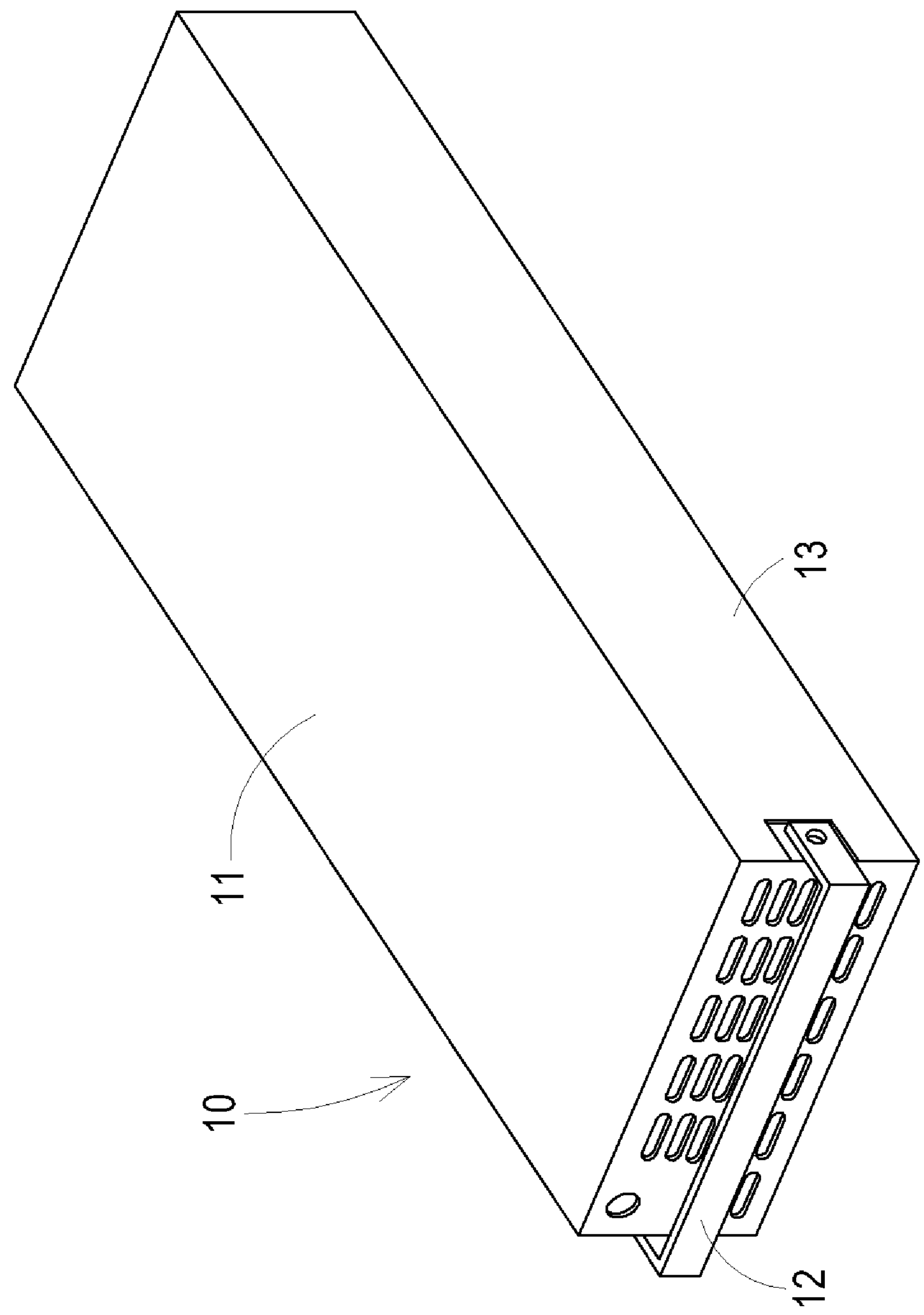
FIG. 1 is a schematic view showing the removable power supplier with fixed handle structure in the prior art.
Figure 2:
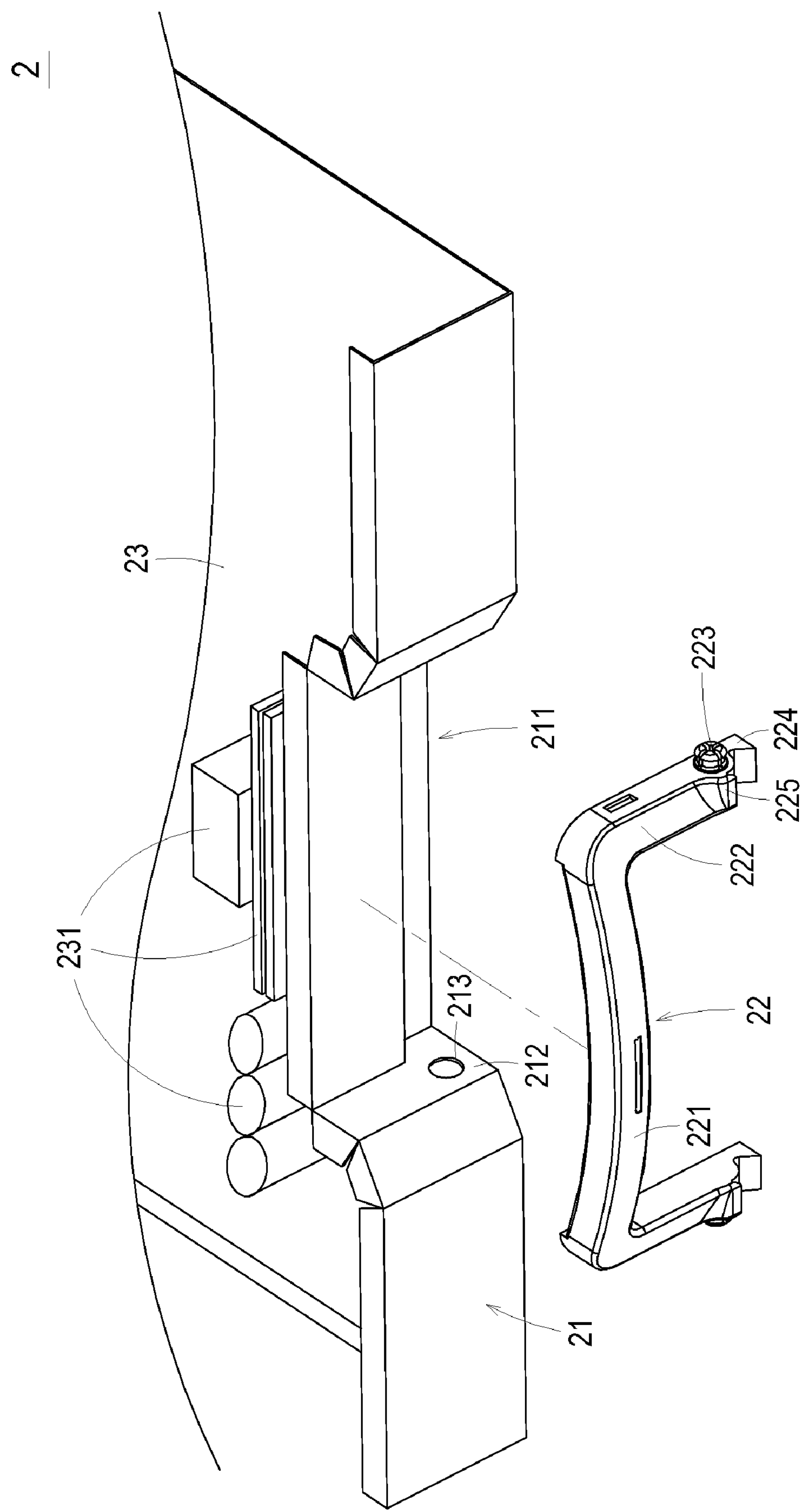
FIG. 2 is a schematic view showing the removable power supplier with handle structure in a first embodiment according to the present invention.

Please refer to FIG. 2, which is a schematic view showing the removable power supplier with handle structure in a first embodiment according to the present invention. As shown, the removable power supplier 2 includes a housing 21 and a handle structure 22, wherein the housing 21 has a printed circuit board 23 mounted therein, and the printed circuit board 23 bears plural electronic elements 231 thereon. The housing 21 is formed to have an inwardly recessed accommodating trough 211 for receiving the idle handle structure. Moreover, the accommodating trough 211 further includes two opposite side walls 212, and the side walls 212 respectively have an engaging component corresponding to each other. In this embodiment, the engaging elements are implemented to be through holes 213, but not limited thereto.

Further refer to FIG. 2. In this embodiment, the handle structure 22 is implemented to have a Π shape which is composed of a holding portion 221 and two symmetrical connecting portions 222, and which can be made of elastic material, but not limited thereto. The two connecting portions 222 respectively have an elastic engaging device corresponding to the engaging components on the side walls. In this embodiment, the elastic engaging device is implemented to be, but not limited, a bulge 223 which can be integrally formed with the handle structure, but not limited thereto. Moreover, the ends of the connecting portions 222 respectively have a first position-limiting portion 224 and a second position-limiting portion 225, for respectively engaging with a first positioning hole 1*b* and a second positioning hole 1*c* on the housing 1*a* of an electronic apparatus 1 (as shown in FIG. 5A), so as to restrict the movement of the handle structure 22.

Figure 3:
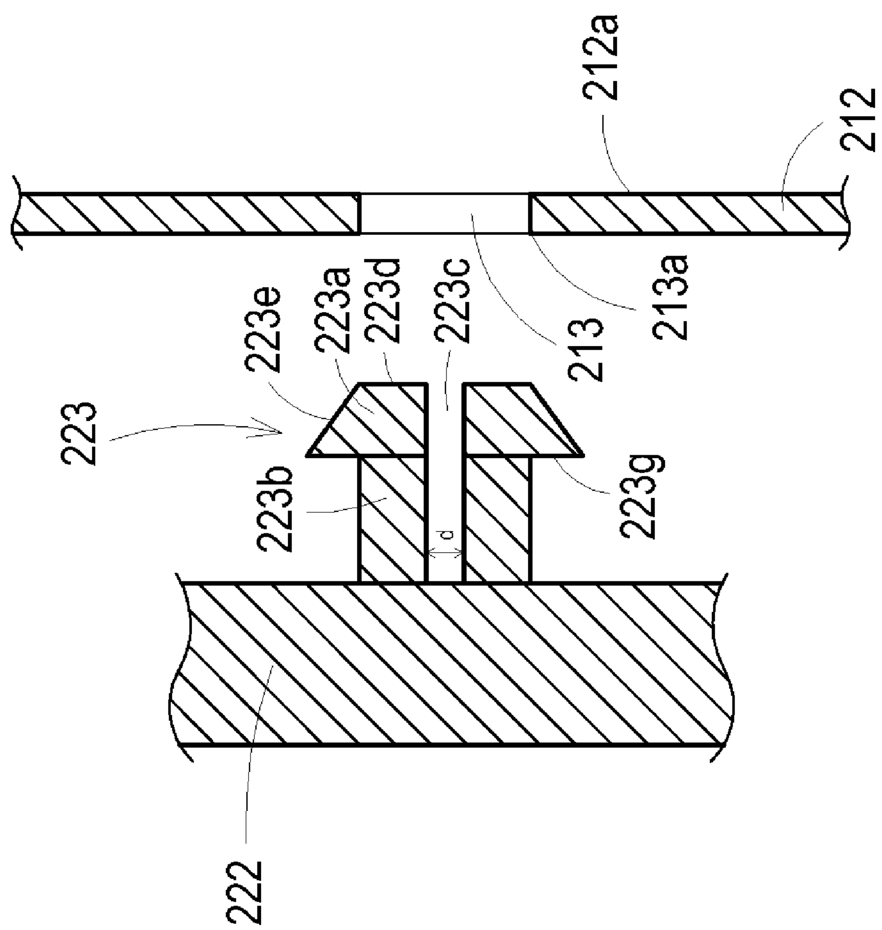
FIG. 3 is a sectional view showing the assembling relationship of the elastic engaging device and the engaging component of FIG. 2.

Please refer to FIG. 3, which is a sectional view showing the assembling relationship of the elastic engaging device and the engaging component of FIG. 2. As shown, the bulge 223 is constituted by a top portion 223*a*, a spool portion 223*b* and at least a slot 223*c*, wherein the top portion 223*a* includes an upper surface 223*d* and inclined planes 223*e*, which are connected to the upper surface 223*d*, and the width of the top portion 223*a* is substantially larger than that of the spool portion 223*b*. Furthermore, the slot 223*c* is formed to run through the top portion 223*a* and the spool portion 223*b* of the bulge 223 and have a width of d. In this embodiment, the bulge 223 is formed to have crossed slots 223*c* (as shown in FIG. 2), and in other embodiments, it also can be implemented as single slot 223*c*, but not limited thereto, and can be varied according to different practical situations.

Figure 4:
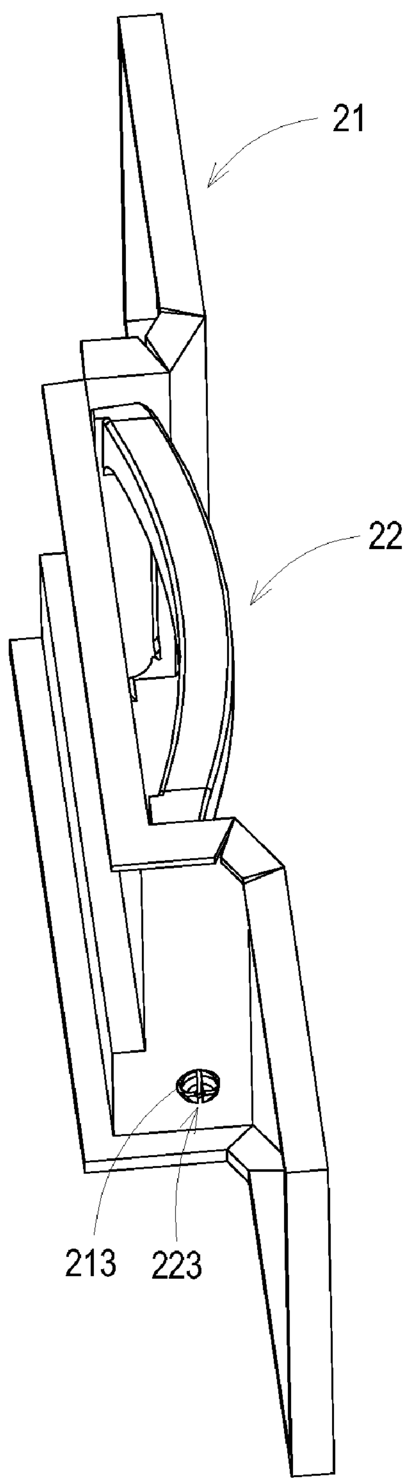
FIG. 4 is a sectional view showing the assembling relationship of the handle structure and the housing of FIG. 2.

Please refer to FIG. 2, FIG. 3 and FIG. 4. When trying to mount the handle structure 22 onto the housing 21 of the removable power supplier 2, the bulges 223 of the handle structure 22 will be aimed at the through holes 213, and then the handle structure 22 is horizontally pushed into the accommodating trough 211. Here, since the handle structure 22 is made of elastic material, when the handle structure 22 is contacted with the side walls 212 and forced to move forward, the connecting portions 222 will produce a transformation owing to the rejection by the side walls 212 for facilitating the entry of the handle structure 22 into the accommodating trough 211 and also the bulges 223 into the corresponding through holes 213. At this time, the upper surface 223*d* of the bulge 223 will reject to the edge 213*a* of the through hole 213 and through the guiding of the inclined planes 223*e*, the top portion 223*a* of the bulge 223 can smoothly slide into the through hole 213. Moreover, during the entry process, since the adjustable width d of the slot 223*c* provides an adjusting space, when the inclined planes 223*e* suffer the force from the edges 213*a*, the top portion 223*a* can be transformed to reduce the volume thereof, so as to facilitate the top portion 223*a* of the bulge 223 to pass through the through hole 213. Then, after the top portion 223*a* passes through the through hole 213, because the force on the upper surface 223*d* and the inclined planes 223*e* disappears, the elastic recoverability provided by the material of the bulge 223 can restore the width d of the slot 223*c*, so that the bulge 223 will outwardly expand to regain the original shape. Then, the bottom surface 223*g* of the top portion 223*a* will reject to the inner surfaces 212*a* of the side wall 212, and the spool portion 223*b* of the bulge 223 will engage in the through hole 213, so that a mutual engagement between the bulge 223 and the through hole 213 is achieved, and thus, the handle structure 22 is engaged with the housing 21 of the removable power supplier 2.

Figure 5B:
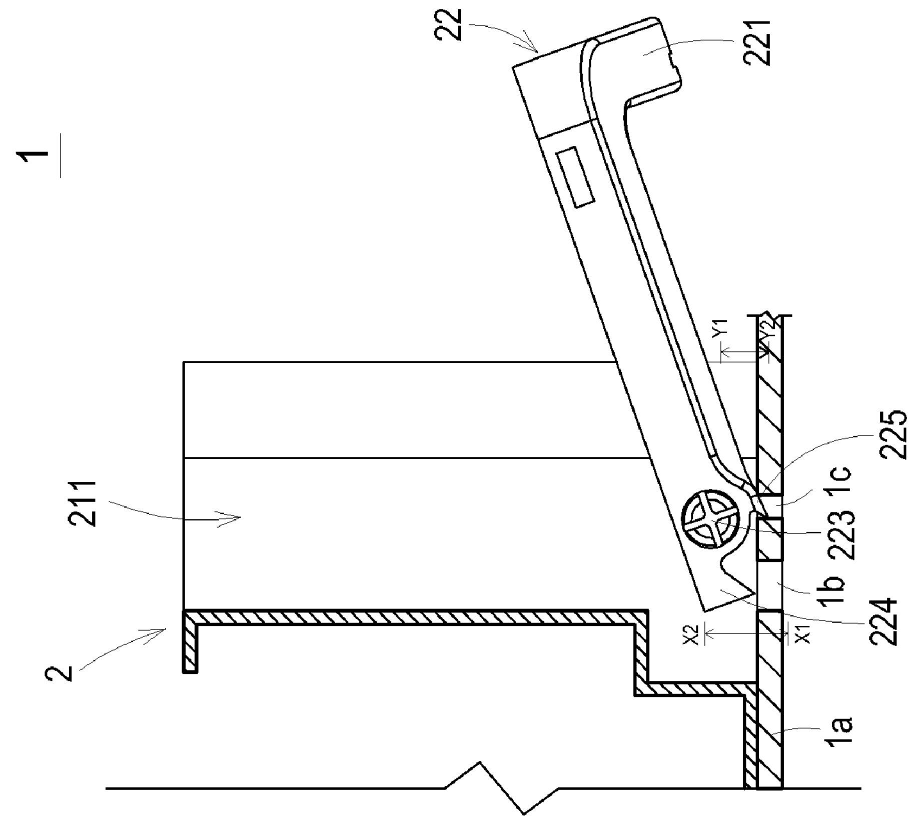
FIG. 5B is a sectional view showing the handle structure of FIG. 5A rotated and pulled out of the accommodating trough of the housing.
Figure 5A:
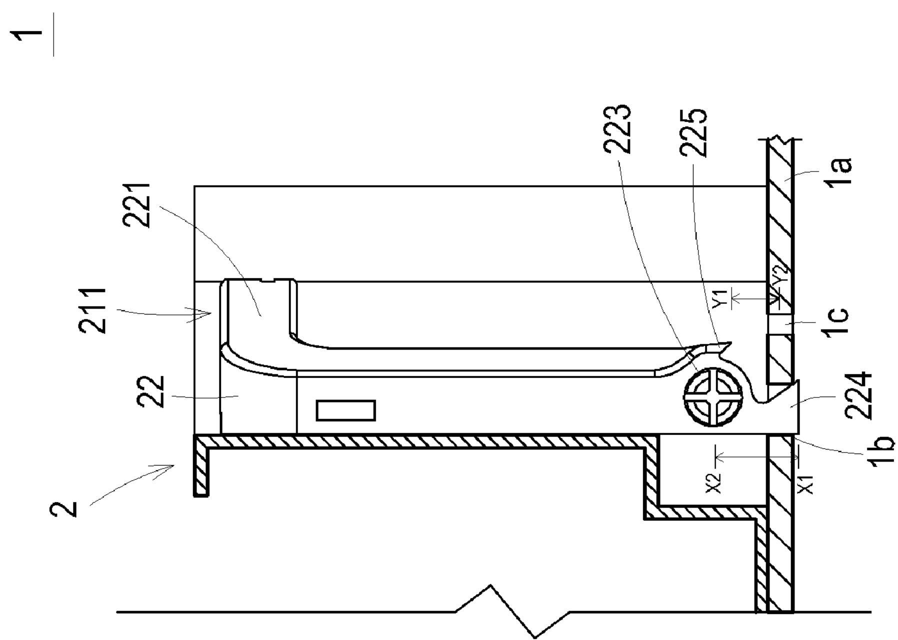
FIG. 5A is a sectional view showing the handle structure of FIG. 2 received by the accommodating trough of the housing.

Please refer to FIG. 5A, which is a sectional view showing the handle structure of FIG. 2 received by the accommodating trough of the housing. As shown, the removable power supplier 2 is located in the electronic apparatus 1 and on a bottom plane 1*a*, which includes a first positioning hole 1*b* and a second positioning hole 1*c*. When the handle structure 22 is received by the accommodating trough 211 of the housing 21, the first position-limiting portion 224 of the handle structure 22 is located at a first position X1 and the second position-limiting portion 225 is located at a third position Y1, and further, the first position-limiting portion 224 passes through and engages with the first positioning hole 1*b* on the bottom plane 1*a*, thereby limiting the handle structure 11 in the accommodating trough 211. Accordingly, when the handle structure 22 is idle, it can be stored in the accommodating trough 211 to save occupied space and also provide appearance integrity.

Please refer to FIG. 5B, which is a sectional view showing the handle structure of FIG. 5A rotated and pulled out of the accommodating trough of the housing. As shown, when the user holds the holding portion 211 for rotating the handle structure to pull out, the handle structure 22 is rotated by taking the bulges 223 as an axle center, and after rotation, the handle structure 22 is exposed out of the accommodating trough 211. During the rotation, the first position-limiting portion 224 moves upwardly from the first position X1 to the second position X2 and separates from the first positioning hole 1*b*, and the second position -limiting portion 225 moves downwardly from the third position Y1 to a fourth position Y2 and passes through and engages with the second positioning hole 1*c* on the bottom plane 1*a*. Through the engagement between the second position-limiting portion 225 and the second positioning hole 1*c*, the downward rotation of the handle structure can be limited, so as to restrict the handle structure at an upward inclined state, which helps the user to pull out the removable power supplier 2.

Figure 6:
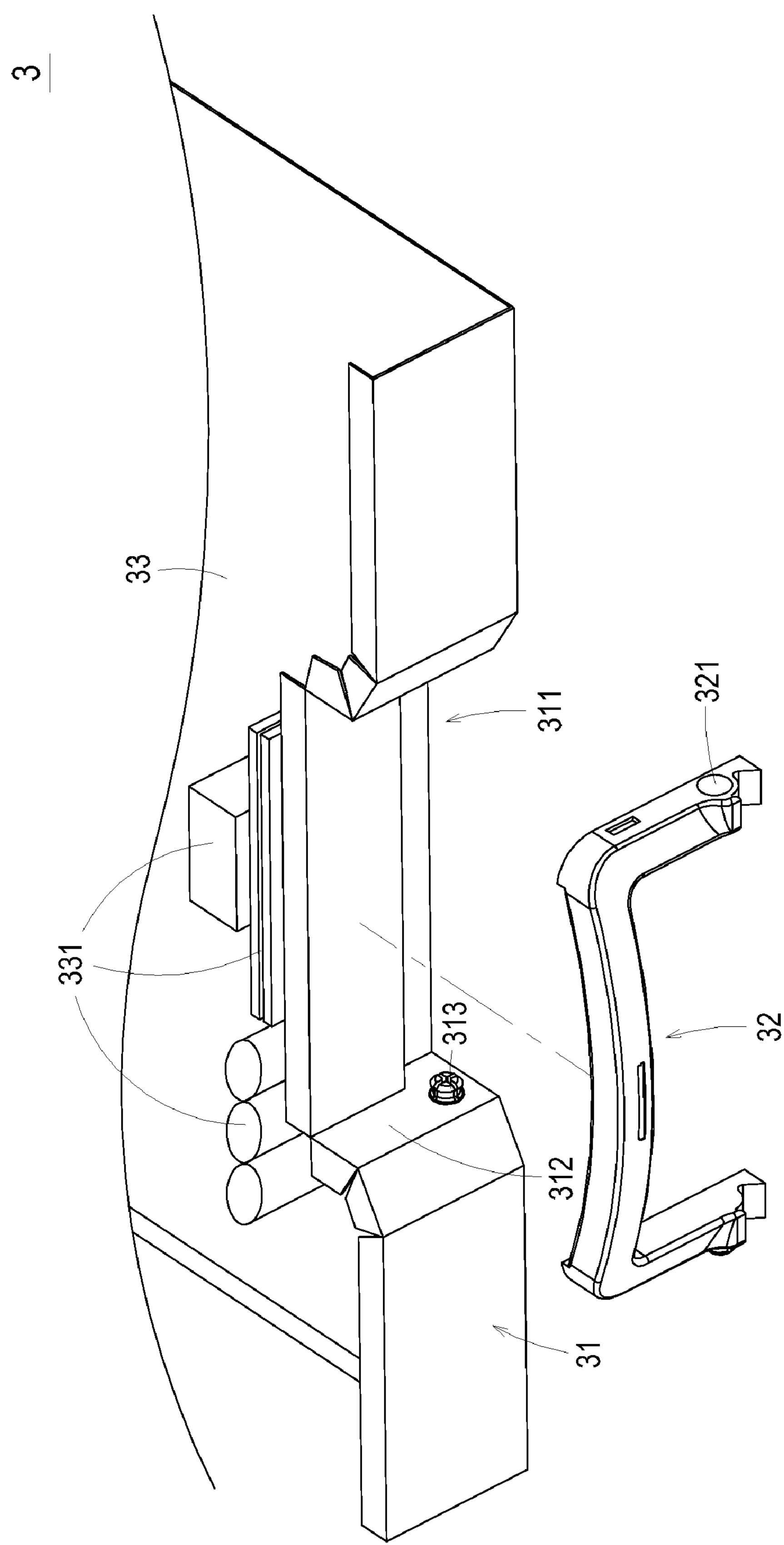
FIG. 6 is a schematic view showing the removable power supplier with handle structure in a second preferred embodiment according to the present invention.

Please refer to FIG. 6, which is a schematic view showing the removable power supplier with handle structure in a second preferred embodiment according to the present invention. As shown, the removable power supplier 3 with handle structure includes a housing 31 and a handle structure 32, wherein the housing 31 has a printed circuit board 33 mounted therein which bears plural electronic elements 331 thereon, and the housing 31 includes an accommodating trough 311 and side walls 312. In this embodiment, the structures and assembling manner of the housing 31, the printed circuit board 33, the electronic elements 331, the accommodating trough 311, the side walls 312 and the handle structure 32 are identical to the embodiment described above, and are omitted. Particularly, in this embodiment, the elastic engaging devices 313 are mounted on the housing 31 and the corresponding engaging components 321 are mounted on the handle structure 32. But, it should be understood that the positions of the elastic engaging devices and the engaging components can be varied according to different demands without limitation. Besides, in this embodiment, the housing 31 can be made of elastic material for providing flexibility or metal material without flexibility, but not limited thereto.

In the aforesaid, the present invention provides a removable electronic device with handle structure which is suitable for an electronic apparatus. Through an engagement between the elastic engaging devices and the engaging components, the handle structure can be pivotally mounted on the accommodating trough formed on the housing of the removable electronic device, so that the occupied space of the handle structure can be saved as idle, and the handle structure also can be rotated out of the accommodating trough by taking the elastic engaging devices as an axle center when the user tries to utilize the handle structure to pull out the removable electronic device. Therefore, not only the occupied space can be saved, the appearance integrity and practicability are also presented.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A removable electronic device with handle structure suitable for an electronic apparatus, comprising: a housing, having an accommodating trough; a handle structure; an elastic engaging device; and an engaging component, corresponding to the elastic engaging device, wherein the handle structure is rotated by taking the elastic engaging device as an axle center, and the handle structure is pivotally mounted on and received in the accommodating trough through an engagement between the elastic engaging device and the engaging component, and the handle structure further comprises a first position-limiting portion and a second position-limiting portion for respectively engaging with a first positioning hole and a second positioning hole formed on a bottom plane of the electronic apparatus, so as to limit the movement of the handle structure.

2. The device as claimed in claim 1, wherein the elastic engaging device is mounted on the handle structure and the engaging component is mounted on the housing.

3. The device as claimed in claim 1, wherein the elastic engaging device is a bulge.

4. The device as claimed in claim 3, wherein the engaging component is a trough hole corresponding to the bulge.

5. The device as claimed in claim 4, wherein the bulge further comprises a top portion, a spool portion and at least a slot, which penetrates through the top portion and the spool portion.

6. The device as claimed in claim 5, wherein the top portion further comprises an upper surface and an inclined plane connected with the upper surface.

7. The device as claimed in claim 6, wherein during an engagement of the bulge and the through hole, the upper surface of the top portion rejects to an edge of the through hole first, the inclined plane guides the top portions to slide into the through hole, and the edge compresses the inclined plane and narrows the slot, so as to pass the top portion through the through hole, and after passing through the through hole, a bottom surface of the top portion rejects to an inner surface of the side wall and the spool portion fixedly positions in the through hole, so as to engage the handle structure with the housing.

8. The device as claimed in claim 1, wherein the elastic engaging device is mounted on the housing and the engaging component is mounted on the handle structure.

9. The device as claimed in claim 1, wherein when the handle structure is received in the accommodating trough of the removable electronic device, the first position-limiting portion of the handle structure is located at a first position and the second position-limiting portion is located at a third position, and further, the first position-limiting portion passes through and engages with the first positioning hole, thereby limiting the handle structure in the accommodating trough.

10. The device as claimed in claim 9, wherein for pulling the handle structure out of the accommodating trough of the removable electronic device, at first, the handle structure is rotated by taking the elastic engaging device as an axle center, and during the rotation, the first position-limiting portion moves upwardly from the first position to the second position and separates from the first positioning hole, and the second position-limiting portion moves downwardly from the third position to a fourth position and passes through and engages with the second positioning hole on the bottom plane, so as to restrict the movement of the handle structure and fix the handle structure at an inclined state.

11. An electronic apparatus, comprising: a removable electronic device with handle structure suitable, comprising: a housing, having an accommodating trough; a handle structure; an elastic engaging device; and an engaging component, corresponding to the elastic engaging device, wherein the handle structure is rotated by taking the elastic engaging device as an axle center, and the handle structure is pivotally mounted on and received in the accommodating trough through an engagement between the elastic engaging device and the engaging component, and the handle structure further comprises a first position-limiting portion and a second position-limiting portion for respectively engaging with a first positioning hole and a second positioning hole formed on a bottom plane of the electronic apparatus, so as to limit the movement of the handle structure.

12. The electronic apparatus as claimed in claim 11, wherein the elastic engaging device is mounted on the handle structure and the engaging component is mounted on the housing.

13. The electronic apparatus as claimed in claim 11, wherein the elastic engaging device is a bulge.

14. The electronic apparatus as claimed in claim 13, wherein the engaging component is a trough hole corresponding to the bulge.

15. The electronic apparatus as claimed in claim 14, wherein the bulge further comprises a top portion, a spool portion and at least a slot, which penetrates through the top portion and the spool portion.

16. The electronic apparatus as claimed in claim 15, wherein the top portion further comprises an upper surface and an inclined plane connected with the upper surface.

17. The electronic apparatus as claimed in claim 11, wherein the elastic engaging device is mounted on the housing and the engaging component is mounted on the handle structure.

18. The electronic apparatus as claimed in claim 12, wherein when the handle structure is received in the accommodating trough of the removable electronic device, the first position-limiting portion of the handle structure is located at a first position and the second position-limiting portion is located at a third position, and further, the first position -limiting portion passes through and engages with the first positioning hole, thereby limiting the handle structure in the accommodating trough.

* * * * *